United States Patent
Sato et al.

(10) Patent No.: US 11,892,533 B2
(45) Date of Patent: Feb. 6, 2024

(54) MAGNETIC RESONANCE IMAGING DEVICE AND CONTROL METHOD THEREOF

(71) Applicant: FUJIFILM Healthcare Corporation, Kashiwa (JP)

(72) Inventors: Ryota Sato, Chiba (JP); Toru Shirai, Chiba (JP); Suguru Yokosawa, Chiba (JP); Yo Taniguchi, Chiba (JP); Yoshitaka Sato, Chiba (JP); Kazuho Kamba, Chiba (JP)

(73) Assignee: FUJIFILM Healthcare Corporation, Chiba (JP)

(*) Notice: Subject to any disclaimer, the term of this patent is extended or adjusted under 35 U.S.C. 154(b) by 2 days.

(21) Appl. No.: 17/835,020

(22) Filed: Jun. 8, 2022

(65) Prior Publication Data

US 2022/0413079 A1 Dec. 29, 2022

(30) Foreign Application Priority Data

Jun. 24, 2021 (JP) ................. 2021-105158

(51) Int. Cl.
| | |
|---|---|
| G01V 3/00 | (2006.01) |
| G01R 33/565 | (2006.01) |
| G01R 33/56 | (2006.01) |
| G06T 5/00 | (2006.01) |
| G06T 5/50 | (2006.01) |
| G01R 33/567 | (2006.01) |

(52) U.S. Cl.
CPC ... *G01R 33/56554* (2013.01); *G01R 33/5608* (2013.01); *G01R 33/5676* (2013.01); *G06T 5/006* (2013.01); *G06T 5/50* (2013.01); *G06T 2207/10088* (2013.01)

(58) Field of Classification Search
CPC .............. G01R 33/3415; G01R 33/543; G01R 33/5659; G01R 33/36; A61B 5/055
USPC ........................................................ 324/309
See application file for complete search history.

(56) References Cited

U.S. PATENT DOCUMENTS 10,262,385 B2    4/2019    Liu et al.

OTHER PUBLICATIONS

Andersson, et al. Neuroimage, 20: 870-888 (2003).

*Primary Examiner* — Walter L Lindsay, Jr.
*Assistant Examiner* — Frederick Wenderoth
(74) *Attorney, Agent, or Firm* — Paul Teng

(57) ABSTRACT

Distortion generated in an image is effectively corrected in imaging using an EPI sequence such as DWI without extending an imaging time. After one excitation RF pulse of EPI is applied, a navigator scan in which the polarity of the phase encoding is opposite to that of the main scan is performed continuously to the main scan, and the distortion of the image by using the navigator scan data obtained by the navigator scan is corrected. In a case of multi-shot, phase information obtained from the navigator scan data for each shot is used to perform phase correction and multi-shot reconstruction on the main scan data of each shot.

15 Claims, 16 Drawing Sheets

MAGNETIC RESONANCE IMAGING DEVICE AND CONTROL METHOD THEREOF

BACKGROUND OF THE INVENTION

Field of the Invention

The present invention relates to a magnetic resonance imaging device, and in particular relates to a technique for improving image quality in diffusion-weighted imaging.

Description of the Related Art

Diffusion-weighted imaging (abbreviated as DWI) is one of imaging methods using a magnetic resonance imaging (hereinafter, referred to as MRI) device. The DWI is a technique that measures an echo signal by applying a motion probing gradient (MPG) having a strong intensity in a plurality of directions (axes) and images a degree of diffusion of water based on a difference in effects of the MPG, and is useful for diagnosing infarctions and tumors that cause diffusion limitation. Since the DWI uses the multi-axis MPG, EPI that can acquire many echoes with one excitation is often used as a pulse sequence.

A problem of the DWI is that images are prone to distortion and blurring. This is caused by an EPI-specific problem that the EPI is easily affected by a non-uniform static magnetic field and a direction of a read gradient changes for each echo, and a problem that a phase is different for each shot in a moving part due to an influence of a pair of strong motion probing gradients (MPG) given for each shot.

A distortion amount is proportional to a frequency (magnetic field intensity distribution), IET (echo interval), and FOV (it is FOV in a y direction if a phase encoding direction is the y direction) for each position. Therefore, in a case of a multi-shot of an Interleave method, the distortion amount becomes proportional to an FOV/number of shots by increasing the number of shots, the distortion amount can be reduced to a fraction of shots, and at the same time, the blurring is also improved. However, in the case of the multi-shot, a measurement time is doubled by the number of shots. In the DWI as described above, since a phase of a moving region changes for each shot due to the MPG, there is also a problem that an artifact due to a phase error occurs in an image obtained by synthesizing signals of the shots.

Meanwhile, it has also been proposed that the signal is acquired by two imaging operations in which polarities of the gradient magnetic field in a phase encoding direction are different, and the distortion is corrected by post-processing (Andersson, et al. Neuroimage 2003; 20: 870 (Non-Patent Literature 1), and U.S. Pat. No. 10,262,385). In this method, since the distortion generated in the y direction is opposite between the two images acquired in different phase directions, the distortion can be removed by calculation between the images.

SUMMARY OF THE INVENTION

In the method described in Non-Patent Literature 1 or the like, since two or more excitation operations are required, there is a problem that the imaging time is extended because imaging is performed twice or more for each shot and for each of different MPG conditions.

By the way, in general, in order to correct phase disturbance due to body movement in the MRI, a scan for collecting navigation echoes (hereinafter, referred to as a navigator scan) is often performed, and it is conceivable to add such a navigator scan even in the above-described DWI. However, the distortion amount obtained by the navigator scan is different from a distortion amount obtained by a scan (referred to as a main scan) that acquires the echo signal for reconstructing an image, and thus the distortion amount obtained by the navigator scan cannot be used as it is and is required to be corrected, and a magnetic field map for correction (a map for obtaining frequency information) is required. Correction using such a magnetic field map can also be a cause of an error.

An object of the invention is to provide a method capable of effectively correcting distortion generated in an image in imaging using an EPI sequence such as DWI without extending an imaging time.

In order to solve the above problems, the invention performs a navigator scan in which the polarity of phase encoding is opposite to the polarity of a main scan continuously to the main scan, and corrects the distortion of the image by using a navigation echo obtained by the navigator scan.

That is, an MRI device of the invention includes a measurement unit configured to collect a nuclear magnetic resonance signal from a subject using a pulse sequence; and an image calculation unit configured to generate an image by using the nuclear magnetic resonance signal collected by the measurement unit. The measurement unit executes a pulse sequence that executes, after applying one excitation RF pulse (1 shot), a main scan for measuring an image reconstruction echo signal and a navigator scan for measuring a distortion correction echo signal, wherein the navigator scan includes a navigator scan in which an applied polarity of phase encoding is opposite to an applied polarity of phase encoding of the main scan. The image calculation unit includes a displacement amount calculation unit configured to calculate a displacement amount of an image by using the echo signal obtained by the navigator scan, and a distortion correction unit configured to correct distortion of the image by using the calculated displacement amount.

In addition, a control method of an MRI device of the invention is a control method of a magnetic resonance imaging device including a measurement unit configured to collect a nuclear magnetic resonance signal from a subject using a pulse sequence, and an image calculation unit configured to generate an image by using the nuclear magnetic resonance signal collected by the measurement unit. The control method of an MRI device of the invention includes a measuring step of causing the measurement unit to execute a pulse sequence that executes, after applying one excitation RF pulse, a main scan for measuring an image reconstruction echo signal and a navigator scan for measuring a distortion correction echo signal, wherein the navigator scan includes a navigator scan in which an applied polarity of phase encoding is opposite to an applied polarity of phase encoding of the main scan; and an image processing step of calculating a displacement amount of an image by using an echo signal obtained by the navigator scan in which an applied polarity of a phase encoding is opposite to that of the main scan, and correcting distortion of the image by using the displacement amount.

The image processing step may include a step of phase-correcting a main scan image by using the echo signal obtained by the navigator scan.

According to the invention, by using the navigator scan image in which the distortion of the image occurs in a direction opposite to the main scan image, the distortion of the image of the main scan can be easily corrected without using a magnetic field map or the like. Since data of the navigator scan can be collected in one shot continuously in the main scan, data for distortion correction is taken, and thus an imaging time is not extended.

Although the invention is suitably applied to the DWI, the invention can be applied to imaging using a sequence in which echoes are continuously collected after one excitation, and a distortion-free image can be obtained.

DESCRIPTION OF EMBODIMENTS

Hereinafter, embodiments of an MRI device according to the invention will be described with reference to the drawings.

Figure 1:
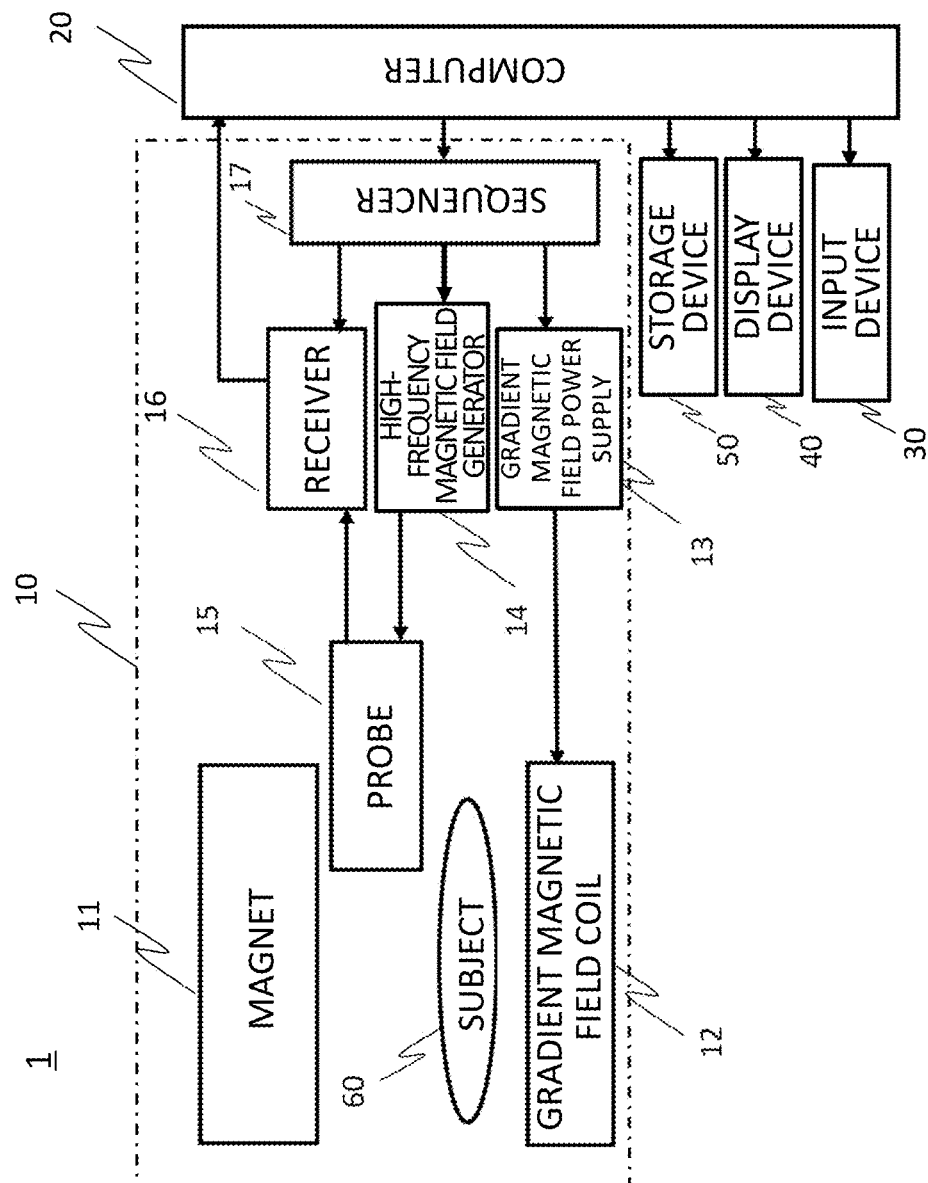
FIG. 1 is a diagram illustrating an overall configuration of an MRI device to which the invention is applied.

FIG. 1 is a block diagram illustrating a schematic configuration of an MRI device 1. The MRI device 1 includes a magnet 11 that generates a static magnetic field in a direction parallel to a subject, a gradient magnetic field coil 12 that generates a gradient magnetic field, a gradient magnetic field power supply 13, a high-frequency magnetic field generator 14, a probe 15 that irradiates a high-frequency magnetic field and detects a nuclear magnetic resonance signal (echo), a receiver 16, a sequencer 17, and a computer 20. A subject (for example, a living body) 50 is placed on a bed (table) or the like, and is disposed in a static magnetic field space generated by the magnet 11. Hereinafter, the magnet 11, the gradient magnetic field coil 12, the gradient magnetic field power supply 13, the high-frequency magnetic field generator 14, the probe 15, the receiver 16, and the sequencer 17 are collectively referred to as a measurement unit 10.

The sequencer 17 sends a command to the gradient magnetic field power supply 13 and the high-frequency magnetic field generator 14 to generate a gradient magnetic field and a high-frequency magnetic field, respectively. The generated high-frequency magnetic field is applied to a subject 60 as a pulsed high-frequency magnetic field (RF pulse) through the probe 15. The nuclear magnetic resonance signal generated from the subject 60 is received by the probe 15 and detected by the receiver 16. The nuclear magnetic resonance signal is referred to as an echo signal in the present specification because the nuclear magnetic resonance signal usually collects an echo which is generated as a gradient echo or a spin echo.

A nuclear magnetic resonance frequency (detection reference frequency $f_0$) that serves as a detection reference in the receiver 16 is set by the sequencer 17. The sequencer 17 controls each part to operate at a pre-programmed timing and intensity. In programs, those describing the high-frequency magnetic field (RF pulse), the gradient magnetic field, and the timing and intensity of signal reception are referred to as pulse sequences.

Various pulse sequences are known depending on purposes, but in the present embodiment, a sequence in which a plurality of echoes are continuously collected after one excitation is adopted. For example, an echo planar imaging (EPI) sequence or a fast spin echo (FSE) sequence is used. The EPI sequence also includes a spin echo (SE)-based EPI sequence using an inversion pulse and a multi-shot EPI divided into a plurality of excitations to perform echo collection. In order to obtain a diffusion-weighted image, a motion probing gradient (MPG) may be used.

Figure 2:
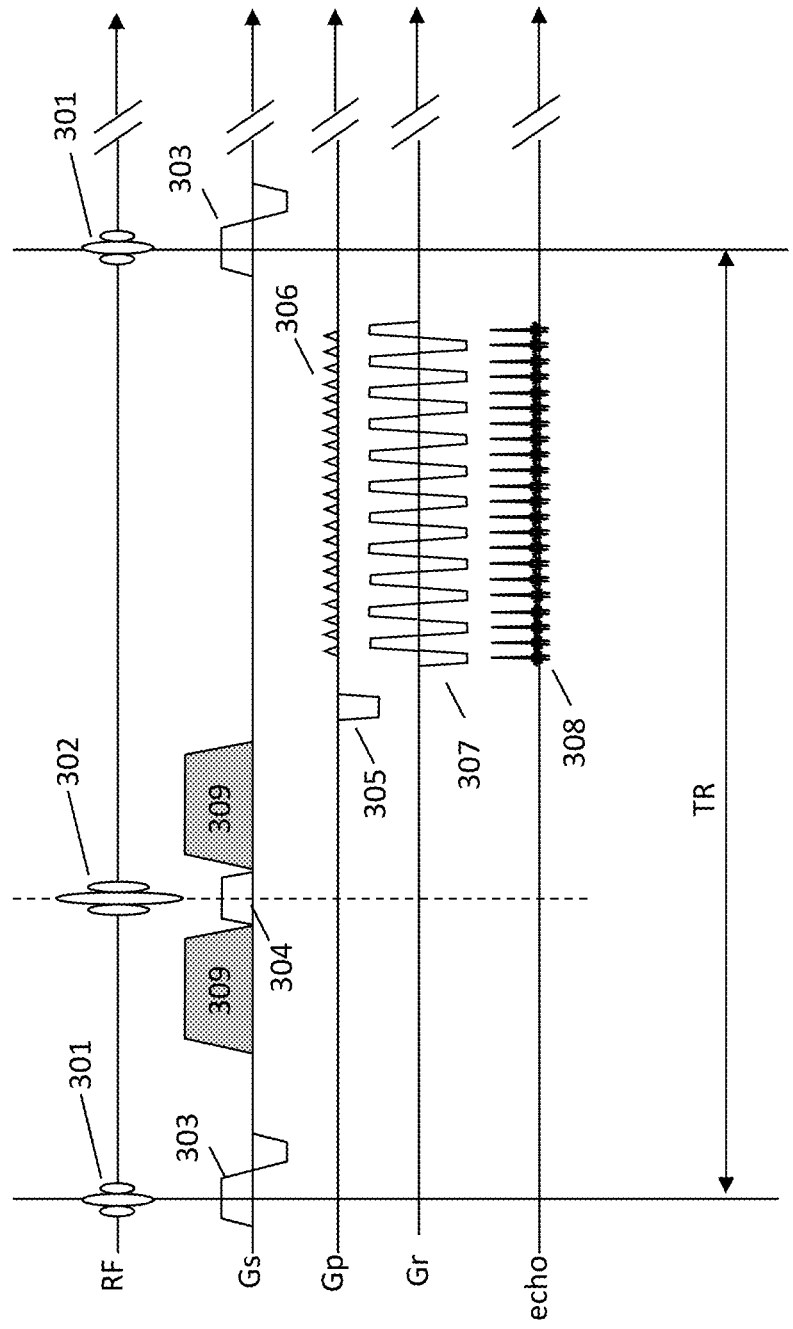
FIG. 2 is a diagram illustrating a general DWI sequence.

An example of an SE-EPI sequence including an MPG pulse is illustrated in FIG. 2. As illustrated in the drawing, an excitation RF pulse 301 is applied together with a slice selective gradient magnetic field 303, and then an inverted RF pulse 302 is applied together with a slice selective gradient magnetic field 304 to excite a desired slice. An MPG pulse 309 having a strong intensity is applied before and after the inverted RF pulse 302. Next, after applying a phase encoding gradient magnetic field 305, a blip-shaped phase encoding gradient magnetic field 306 and a lead-out gradient magnetic field 307 that inverts a polarity are continuously applied, and an echo signal 308 is collected during the application of the inverted lead-out gradient magnetic field 307. FIG. 2 illustrates a case where the MPG pulse is applied to an axis of a slice gradient magnetic field Gs, but usually, the axis (direction) to which the MPG pulse 309 is applied is different, and imaging is performed a plurality of times. With a single-shot EPI, all echo signals in the number required for image reconstruction are measured with one excitation.

Further, although not illustrated in FIG. 2, in the present embodiment, a sequence for collecting a navigator echo used for distortion correction is added following the collection of the echo signal for the image reconstruction. A sequence until the echo signal for the image reconstruction is collected is referred to as the main scan, and a sequence for collecting the subsequent navigator echo is referred to as the navigator scan. Details of the navigator scan will be described later.

The computer 20 controls an operation of the measurement unit 10 described above, receives a signal detected by the measurement unit (the receiver 16) 10, that is, the echo signal of the main scan and the signal of the navigator scan (navigator echo), and performs signal processing such as image reconstruction. In addition, the computer 20 may include an input device 30 for a user to input an imaging condition, a processing condition, and the like, a display device 40 that displays an image of a subject obtained as a result of signal processing and an image (GUI) that serves as an interface with the user, and a storage device 50 that stores a processing result, data necessary for processing, and the like. The storage device 50 includes an external storage device connected to the computer 20 via a network as well as a device connected to the computer 20 by wire or wirelessly.

Figure 3:
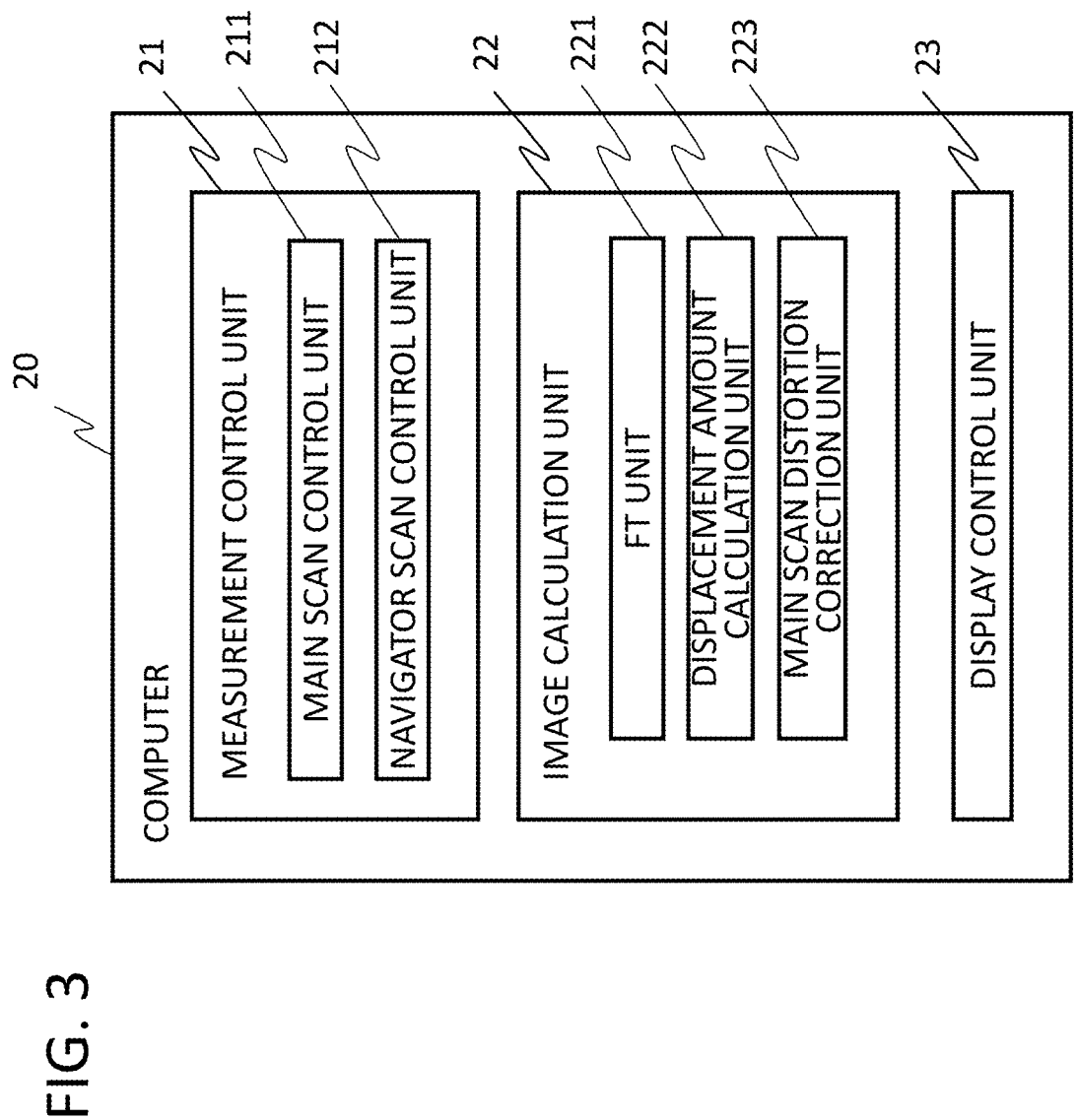
FIG. 3 is a functional block diagram of a computer provided in an MRI device of an embodiment.

FIG. 3 illustrates a configuration example of the computer 20 that implements the above functions. As illustrated in FIG. 3, the computer 20 includes a measurement control unit 21 that controls the operation of the measurement unit 10, an image calculation unit 22 that performs calculation such as image reconstruction by using a signal received from the measurement unit 10, and a display control unit 23. The measurement control unit 21 includes a main scan control unit 211 and a navigator scan control unit 212, sends a predetermined pulse sequence, a user-specified imaging condition (imaging parameter), and the like to the sequencer 17, and controls the measurement unit 10. The image calculation unit 22 includes an FT unit 221 that performs a calculation for converting, into real space data, data (k-space data) in which the measurement signal is provided in a k-space, for example, a Fourier transform, a displacement amount calculation unit 222 that calculates distortion (displacement amount) that occurs in the image by using the data obtained by the navigator scan, and a distortion correction unit 223 that corrects distortion of the main scan image or the like by using the displacement amount calculated by the displacement amount calculation unit 222 (in the drawing, the main scan distortion correction unit that corrects the distortion of the main scan image is illustrated as an example). These configurations produce a distortion-corrected image, such as a diffusion-weighted image. The image is displayed on the display device 40 by the display control unit 23 together with necessary incidental information (for example, information on the imaging condition and the subject). The computer 20 stores the detected signal, the imaging condition, image information after signal processing, and the like in the storage device 50, if necessary.

A function of the computer 20 is implemented by uploading a pre-designed program by a CPU or GPU of the computer 20. A part of the function of the computer 20 may be implemented by hardware such as an ASIC and an FPGA.

Figure 4:
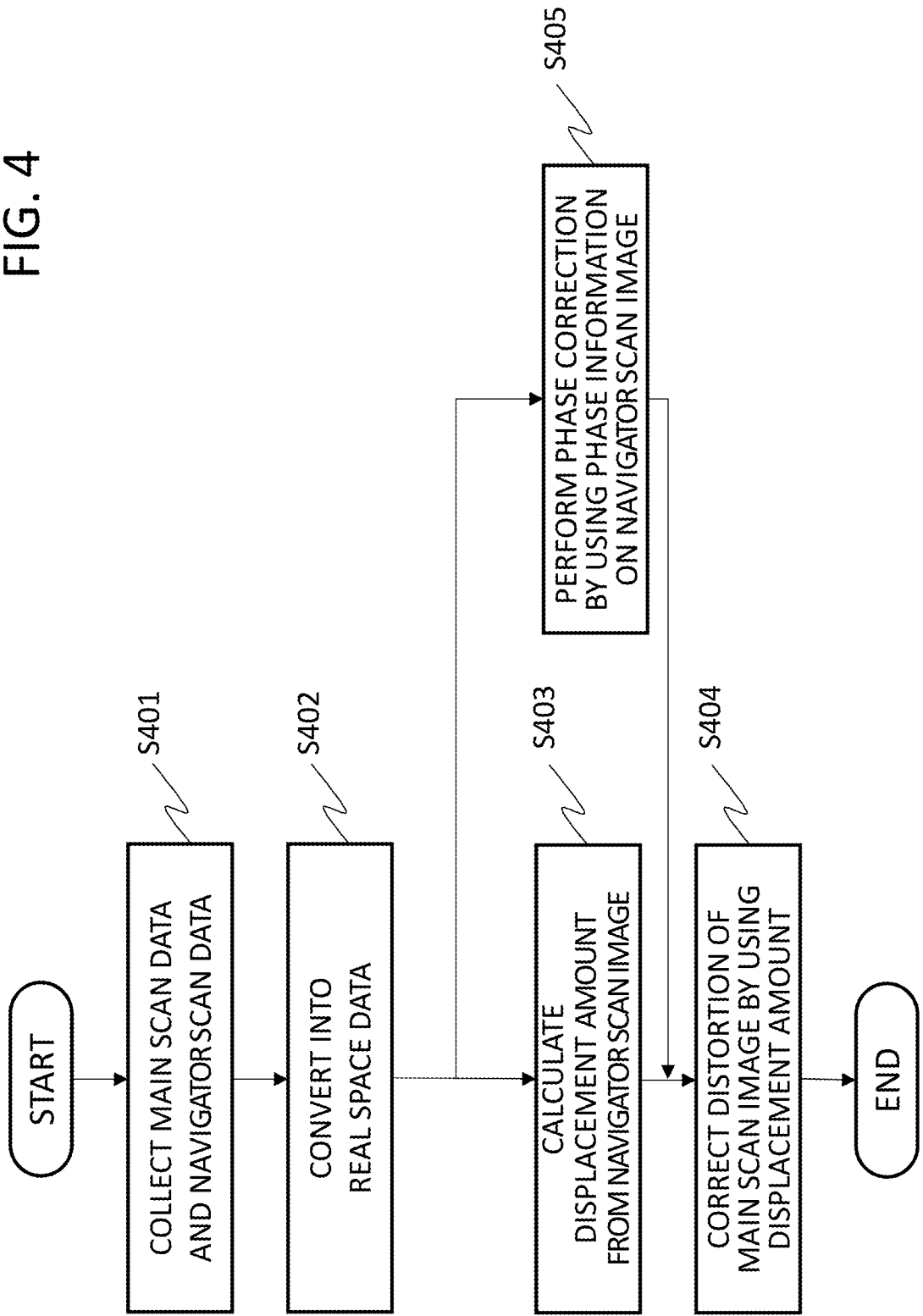
FIG. 4 is a flow illustrating an example of an operation of the MRI device of the embodiment.

FIG. 4 illustrates an outline of an operation of the MRI device (controlled by each control unit of the computer 20) in the above configuration. First, when the pulse sequence and the imaging condition are set according to a user setting via the input device 30, an inspection protocol set in advance, or the like, the main scan control unit 211 and the navigator scan control unit 212 send a command to the sequencer 17 according to the set condition. Under the control of the sequencer 17, the measurement unit 10 executes an EPI sequence including the navigator scan, collects the echo signal of the main scan and the echo signal of the navigator scan, and obtains main scan data and navigator scan data which are the measurement space data (S401).

In the image calculation unit 22, first, the FT unit 221 converts the main scan data and the navigator scan data into real-space complex data, and generates the main scan image and the navigator scan image (S402). Since the applied polarities of the phase encoding are reversed in the main scan data and the navigator scan data, the distortion generated in the main scan image and the navigator scan image because of accumulation of a phase error due to non-uniformity of the static magnetic field or the like becomes distortion in a reverse direction. The displacement amount calculation unit 222 calculates a displacement amount (a displacement amount in a real space) used for distortion correction by using the navigator scan image (S403). The distortion correction unit 223 uses this displacement amount to correct the distortion of the main scan image (S404).

An echo planar sequence executed in the measuring step S401 may be a single-shot EPI that collects all the echoes required for image reconstruction by applying the RF pulse once (referred to as one shot), or a multi-shot EPI. In a case of the multi-shot EPI, it is preferable to include a process (S405) for correcting a phase error that occurs between shots. In particular, in an imaging method using a motion probing gradient (MPG) having a strong intensity such as the DWI, in the case of multi-shot, the phase error between shots becomes large, and thus it is preferable to perform the above phase correction.

Hereinafter, embodiments of the MRI device of the invention will be described based on the outline of the MRI device described above. Configurations common to the configurations of FIGS. 1 to 4 will be described with reference to the drawings as appropriate.

First Embodiment

In the present embodiment, the measurement unit 10 performs a single-shot main scan that collects all echo signals for image reconstruction after one excitation RF pulse, and then performs a navigator scan. In the navigator scan, the polarity of the phase encoding gradient magnetic field is opposite to the polarity of the main scan, an image having distortion in a direction opposite to the image obtained by the main scan is obtained, and the distortion of the main scan image is corrected by using the displacement amount using the image.

Figure 5:
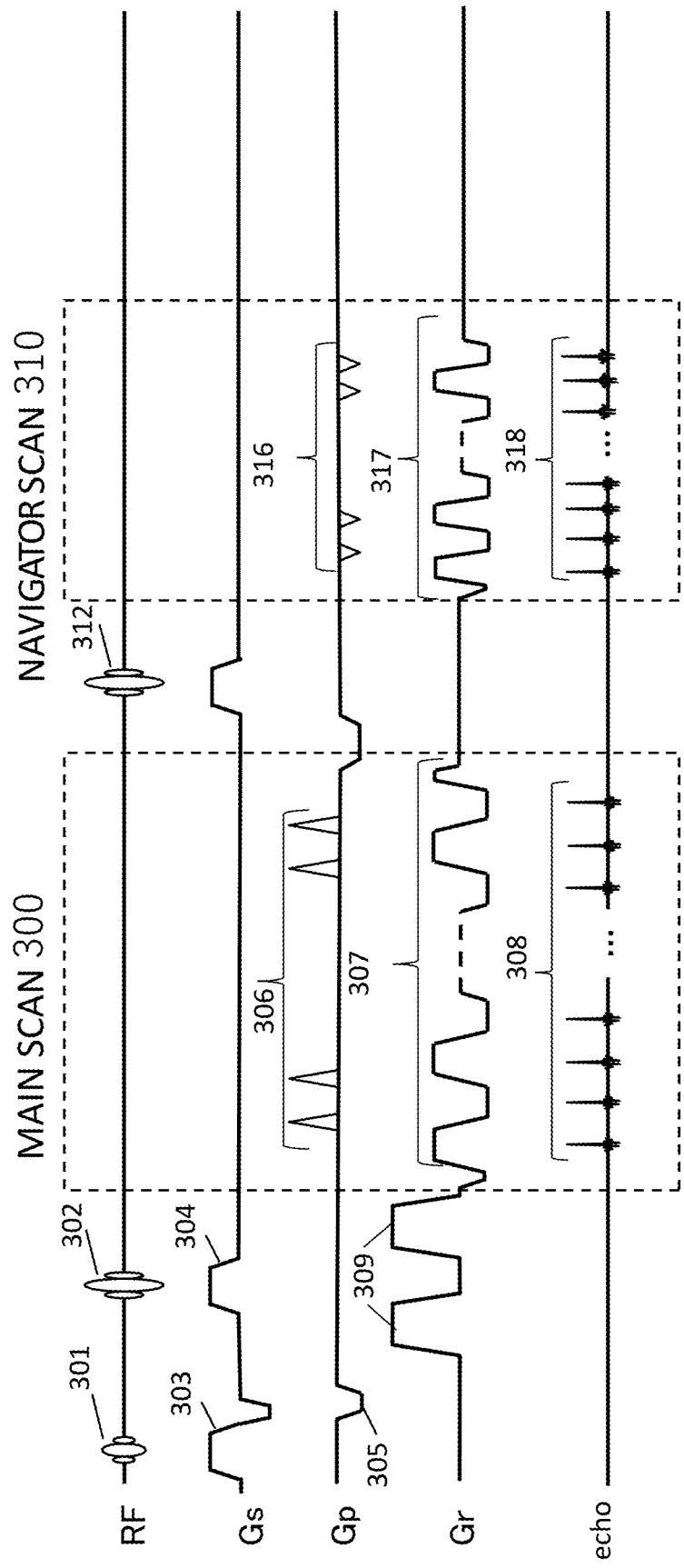
FIG. 5 is a diagram illustrating an example of a pulse sequence of a first embodiment.

An example of a pulse sequence of the present embodiment is illustrated in FIG. 5.

The pulse sequence is executed by the measurement unit 10 under the control of the measurement control unit 21 (the main scan control unit 211 and the navigator scan control unit 212). As illustrated in FIG. 5, the pulse sequence includes a main scan 300 that collects echoes for images by applying an inversion pulse 302 after the application of one excitation pulse 301, and a navigator scan 310 that collects navigator echoes after the subsequent application of the inversion pulse 312. Unlike FIG. 2, FIG. 5 illustrates a case where an application axis of the MPG pulse 309 is a Gr axis, but an application axis of the MPG is optional, and the other configurations are the same as those in FIG. 2 for the main scan.

In the navigator scan 310, the polarity of a phase encoding pulse 316 is set to be opposite to the polarity of the phase encoding pulse 306 of the main scan 300, and the navigator echo 318 is collected for each inversion of a readout 317. The number or range of the navigator echoes 318 to be collected is not particularly limited as long as a full FOV (the same as the FOV of the main scan image) image can be obtained as the reconstructed navigator scan image, and in the illustrated example, the phase encoding pulse 306 is set to have a smaller applied intensity than the main scan, and data in the vicinity of the center of the k-space (low frequency region) is collected.

Figure 6:
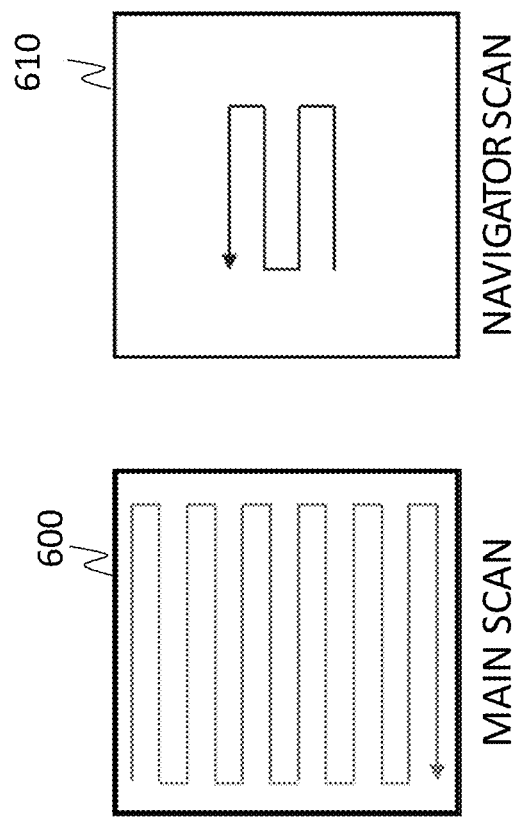
FIG. 6 is a diagram illustrating an example of k-space data obtained by a main scan and a navigator scan.

Since the main scan 300 and the navigator scan 310 are set to have opposite polarities of the phase encoding gradients to collect echoes, as illustrated in FIG. 6, in the main scan, the k-space is scanned from top to bottom, whereas in the navigator scan, the k-space is scanned from bottom to top.

Or vice versa. In FIG. 6, a left side is data 600 of the main scan, and a right side is data 610 of the navigator scan.

Figure 7:
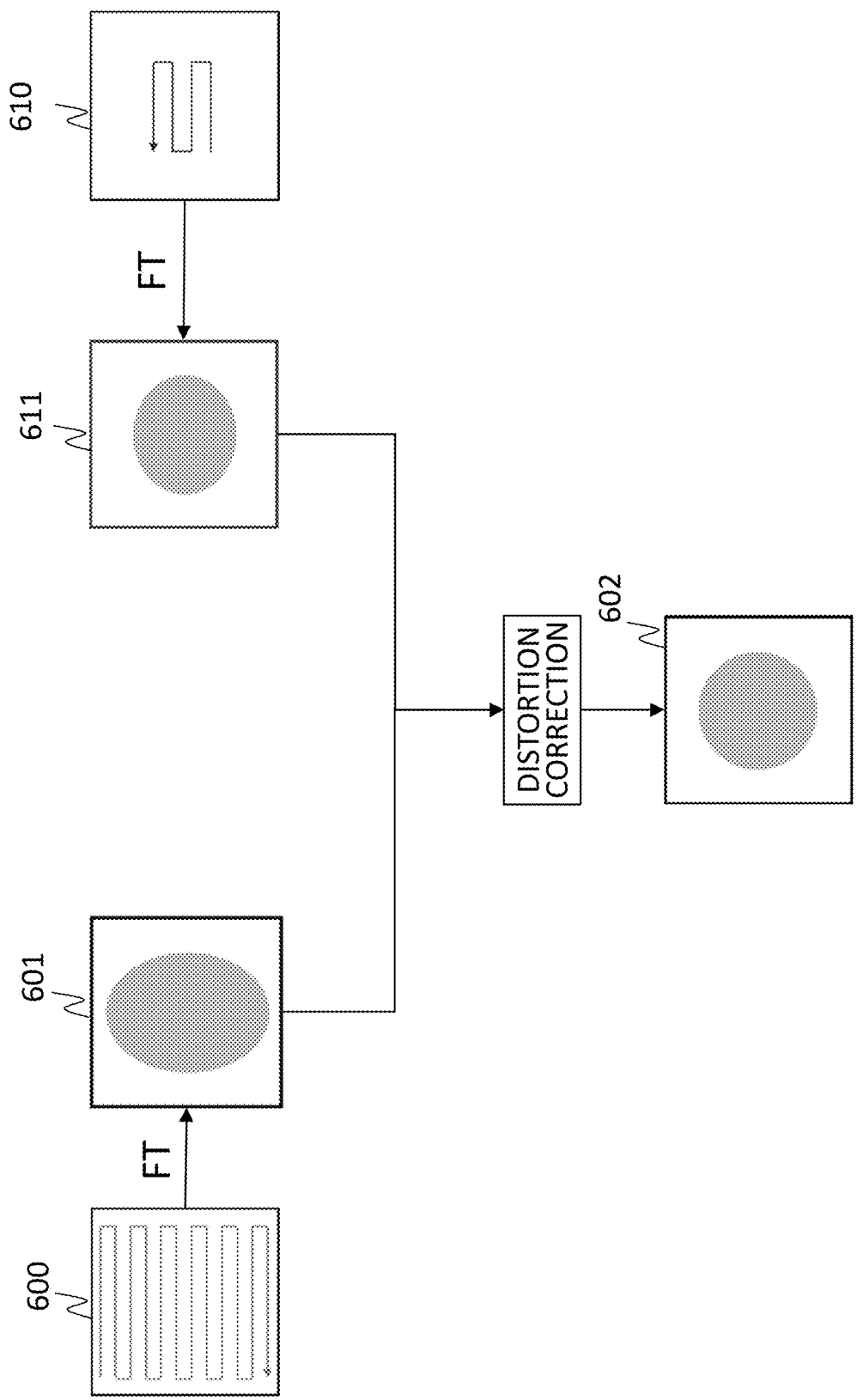
FIG. 7 is a diagram illustrating a process of the first embodiment.

Next, processing of the image calculation unit 22 will be described with reference to FIG. 7. First, the FT unit 221 converts the k-space data 600 obtained by the main scan and the k-space data 610 obtained by the navigator scan into real space data (image data) 601, 611 by Fourier transform (FT), respectively. In this case, the k-space data 610 obtained by the navigator scan is performed with FT by filling surrounding data with zero so that a matrix size of the obtained image matches a matrix size of the main scan image. Accordingly, the navigator scan image has a low spatial resolution, but has the same matrix size as the main scan image.

Next, the displacement amount calculation unit 222 calculates the displacement amount for correcting the main scan image 600. The distortion generated in the images 601, 611 is expressed by the following formula, where the distortion amount at a point (x, y) is Δy [mm].

$$\Delta y = f_0(x, y) \cdot IET \cdot \frac{FOV_y}{R \cdot N_{sh}} \quad (1)$$

Here, $f_0$ represents a frequency [kHz], IET represents an echo interval [ms] in one shot, $FOV_y$ represents FOV [mm] in a y direction, R represents the reduction factor (R-factor) when parallel imaging is performed, and $N_{sh}$ represents the number of shots when multi-shot imaging is performed (hereinafter, the same applies).

As illustrated in Formula (1), in order to calculate the distortion amount of each image, a magnetic field map has been required to obtain the frequency $f_0$, but in the present embodiment, the displacement amount is obtained by utilizing a matter that the distortions of both images are in opposite directions. Specifically, since the directions of distortion are opposite between the main scan image and the navigator scan image, as illustrated in FIG. 7, for example, when the main scan image 601 becomes an image extended in a phase direction, the navigator scan image 611 becomes an image contracted in the phase direction (an image extended in a reading direction). The displacement amount calculation unit 222 uses these images to calculate the displacement amount for correcting the distortion of the main scan image.

There are various known examples of a method for obtaining a magnetic field distribution from two images having different polarities, and for example, the method described in Non-Patent Literature 1 can be used.

The distortion correction unit 223 uses the calculated displacement amount to correct the distortion of the main scan image, and generates a corrected image 602. The image calculation unit 22 performs this correction processing for each image having a different MPG to obtain a desired DWI image.

According to the present embodiment, by collecting echo signals in which the distortion of the image occurs in the opposite direction by navigator scan, distortion correction can be performed without extending the imaging time. In the above embodiment, the case where the imaging method is the DWI has been described, but the present embodiment can be similarly applied to EPI-based imaging without using the MPG.

Second Embodiment

Although the single-shot EPI sequence is used in the first embodiment, in the present embodiment, a multi-shot EPI sequence is used, and a navigator echo is used to perform phase correction between shots, and then images of the shots are synthesized. Then, the distortion of the image is corrected by using the navigator echo.

Figure 8:
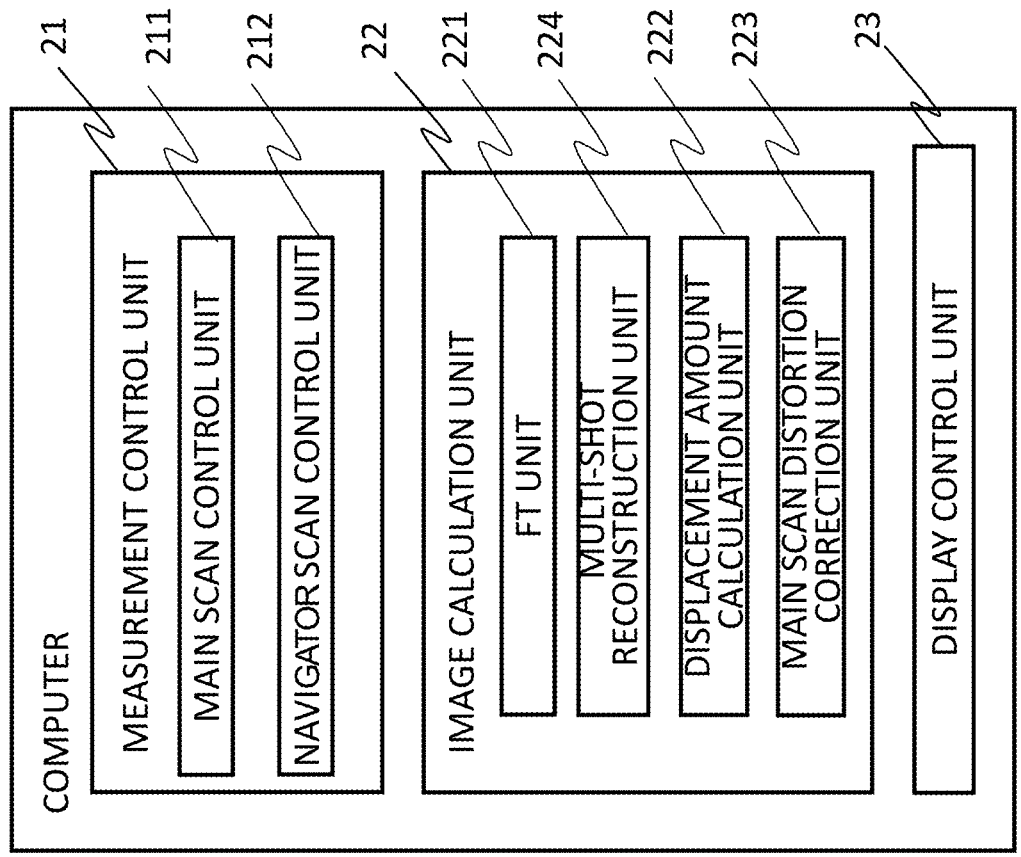
FIG. 8 is a functional block diagram of a computer of a second embodiment.

Therefore, in the computer 20 of the present embodiment, as illustrated in FIG. 8, a multi-shot reconstruction unit 224 is added to the image calculation unit 22. Other elements are the same as those in the first embodiment illustrated in FIG. 3.

Hereinafter, processing of the present embodiment will be described.

Figure 9:
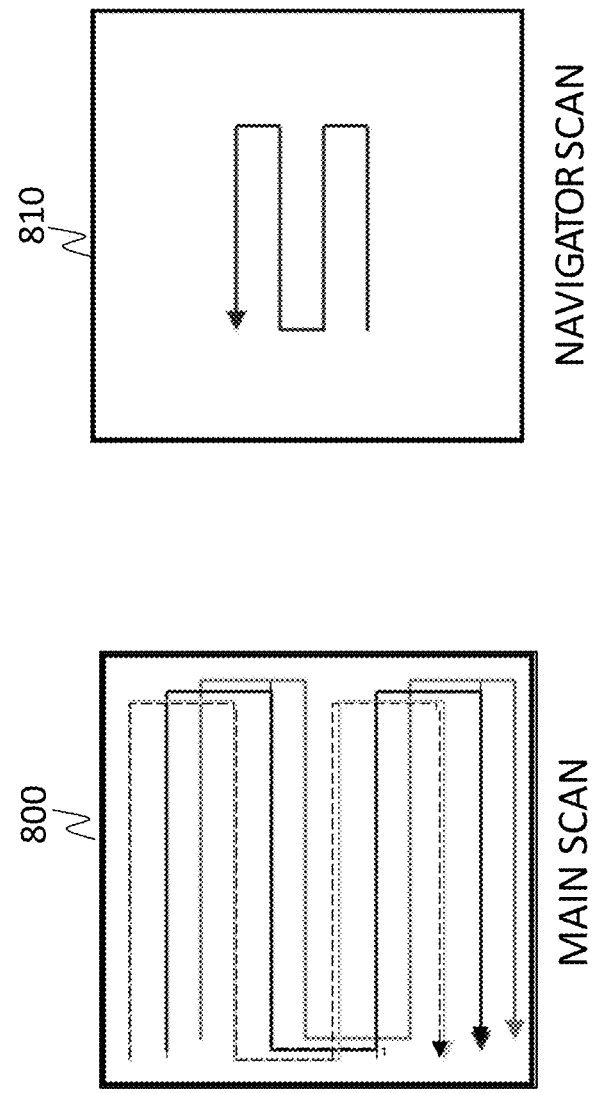
FIG. 9 is a diagram illustrating an example of k-space data obtained by a main scan and a navigator scan of the second embodiment.

Under the control of the measurement control unit 21, a multi-shot EPI sequence is executed. The EPI sequence adopted in the present embodiment is the same as the pulse sequence illustrated in FIG. 5, except that the number of echo signals collected by one excitation and a phase encoding step are different, and the excitation RF pulse 301 to the navigator scan are repeated for the number of shots. In the shots of the main scan, by making a phase encoding offset 305 and the phase encoding step different, data of different lines in a k-space are collected, and finally k-space data 800 as illustrated in FIG. 9 is obtained. The navigator scan following the main scan is the same as that of the first embodiment, and navigator scan data 810 in a central region of the k-space is obtained by using the phase encoding having a polarity opposite to the polarity of the main scan.

Figure 10:
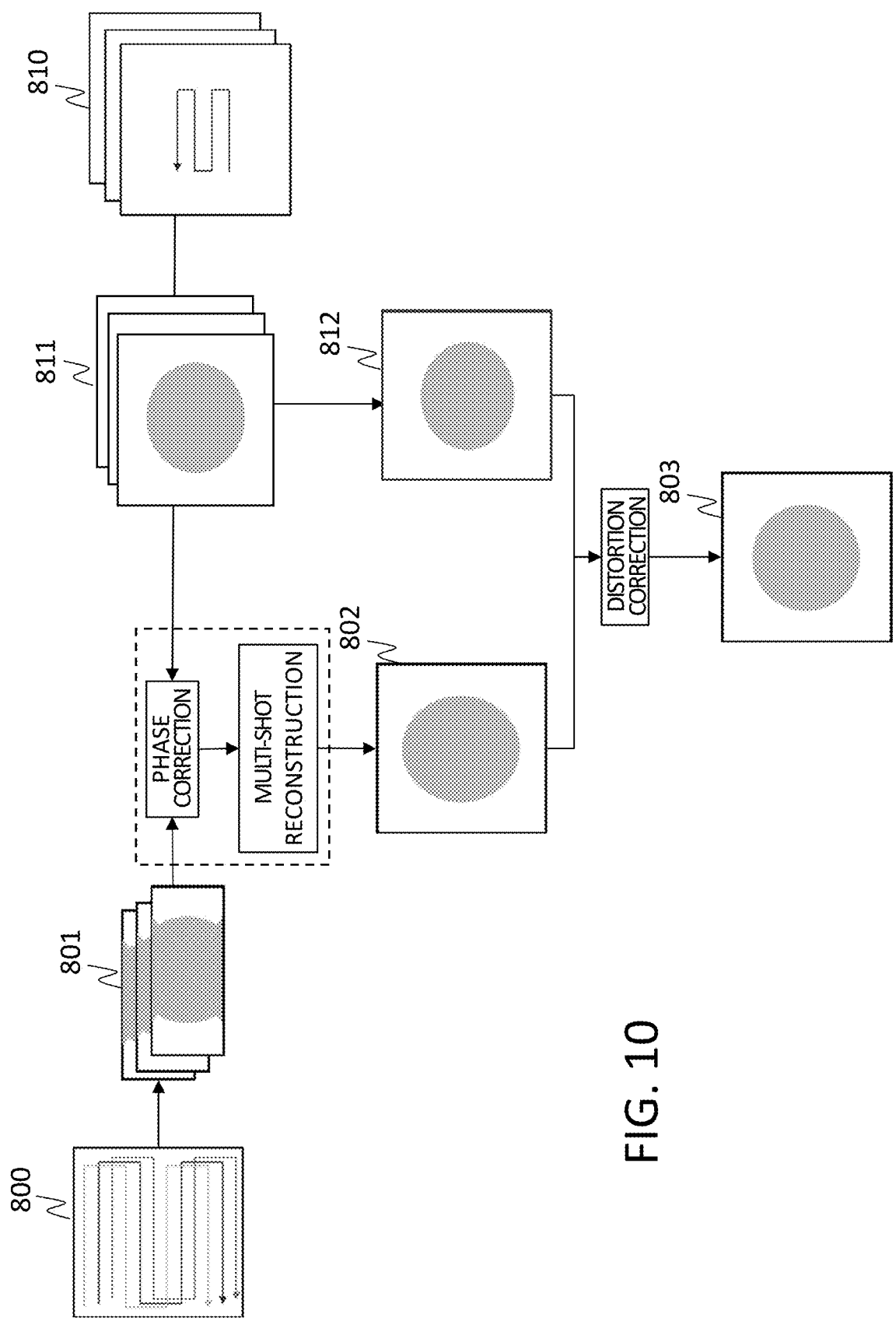
FIG. 10 is a diagram illustrating a process of the second embodiment.

The image calculation unit 22 uses the main scan data 800 and the navigator scan data 810 obtained for each shot to synthesize a plurality of main scan images obtained by the multi-shot, and corrects distortion of the synthesized image. In the present embodiment, during the reconstruction, phase information between shots obtained from the navigator scan data obtained for each shot is used to correct the phase of the main scan image of each shot. Distortion correction is performed, in the same manner as in the first embodiment, on the synthesized main scan image whose phase is corrected in the above manner. Details of the processing will be described with reference to FIG. 10.

First, the FT unit 221 generates a main scan image 801 and a navigator scan image 811 by using the main scan data 800 and the navigator scan data 810 for each shot. The multi-shot reconstruction unit 224 calculates a phase difference between the images from the navigator scan image 811 obtained for each shot, uses information on the phase difference to synthesize the main scan image 801 of each shot, and obtains one main scan image 802. Information for correcting the phase difference between shots is calculated by obtaining the phase from a real part and an imaginary part of the navigator scan image 811 which is a complex image and making a difference between the shots. By using this phase difference, the phase of the main scan image of each shot can be corrected.

There are various known examples of the phase correction in multi-shot imaging, and can be corrected by using, for example, the following formula.

$$(\varphi_{aft}(x,y) = \arg(\exp(i \cdot (\varphi_{bef}(x,y) - \varphi_{navi}(x,y)))) \quad (2)$$

Here, $\varphi_{aft}$ represents the phase of the corrected main scan image, $\varphi_{bef}$ represents the phase of the main scan image before the correction, and $\varphi_{navi}$ represents a phase of a navi-image. In this way, the phase correction can be performed for each voxel in the image space.

By synthesizing after performing phase correction in this way, a synthesized image 802 without artifacts due to the phase difference for each shot can be obtained.

Subsequently, as in the first embodiment, the displacement amount calculation unit 222 calculates the displacement amount by using the main scan synthesized image 802 and a navigator scan image 812, and corrects the distortion of the main scan synthesized image 802 by using the displacement amount. The navigator scan image 812 used for calculating the displacement amount may be obtained by synthesizing the navigator scan images 811 of the shots, or may use any of the navigator scan images 811.

According to the present embodiment, since the phase error between the images is corrected when multi-shot reconstruction is performed, distortion can be corrected more accurately.

Third Embodiment

In the first and second embodiments, the scan in which the applied polarity of the phase encoding is opposite to the applied polarity of the main scan is performed as the navigator scan, but the present embodiment is characterized in that a pair of navigator echoes having different applied polarities of the phase encoding are collected in the navigator scan to obtain a pair of navigator scan images having different distortion directions, and the distortion-corrected main scan image is obtained by using phase difference information and distortion information included in the pair of navigator scan images. The present embodiment can also be applied when the main scan is a single-shot EPI, but here, a case of a multi-shot EPI will be described as an example.

The configuration of the computer 20 of the present embodiment is the same as that of FIG. 8, but the displacement amount calculation unit 222 functions as a displacement map calculation unit that calculates a displacement map using the pair of navigator scan images.

Figure 11:
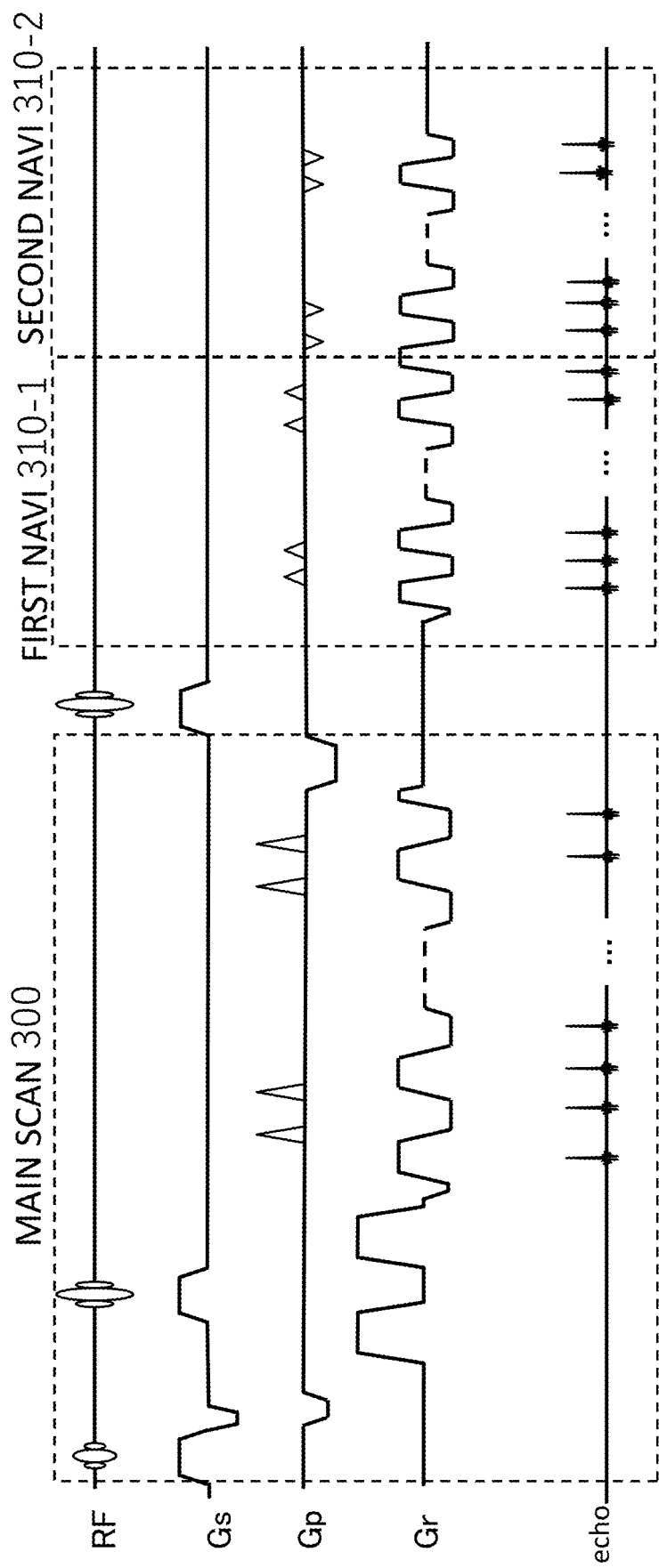
FIG. 11 is a diagram illustrating an example of a pulse sequence of a third embodiment.

Hereinafter, the processing of the present embodiment will be described with reference to FIGS. 11 and 12.

Under the control of the measurement control unit 21, the multi-shot EPI sequence is executed. An example of the EPI sequence adopted in the present embodiment is illustrated in FIG. 11. In the pulse sequence, the main scan 300 is the same as the main scan of the second embodiment (or the first embodiment), and the navigator scan includes a scan 310-1 (first navigator scan) in which phase encoding is performed with the same polarity as that of the main scan and a scan 310-2 (second navigator scan) in which the phase encoding is performed with an opposite polarity. Either the navigator scan 310-1 or the navigator scan 310-2 may be performed first. In the two navigator scans, data of a central region of a k-space is collected as in the first and second embodiments. Accordingly, two pieces (or two sets) of navigator scan data that scan the k-space in the opposite direction can be obtained.

Figure 12:
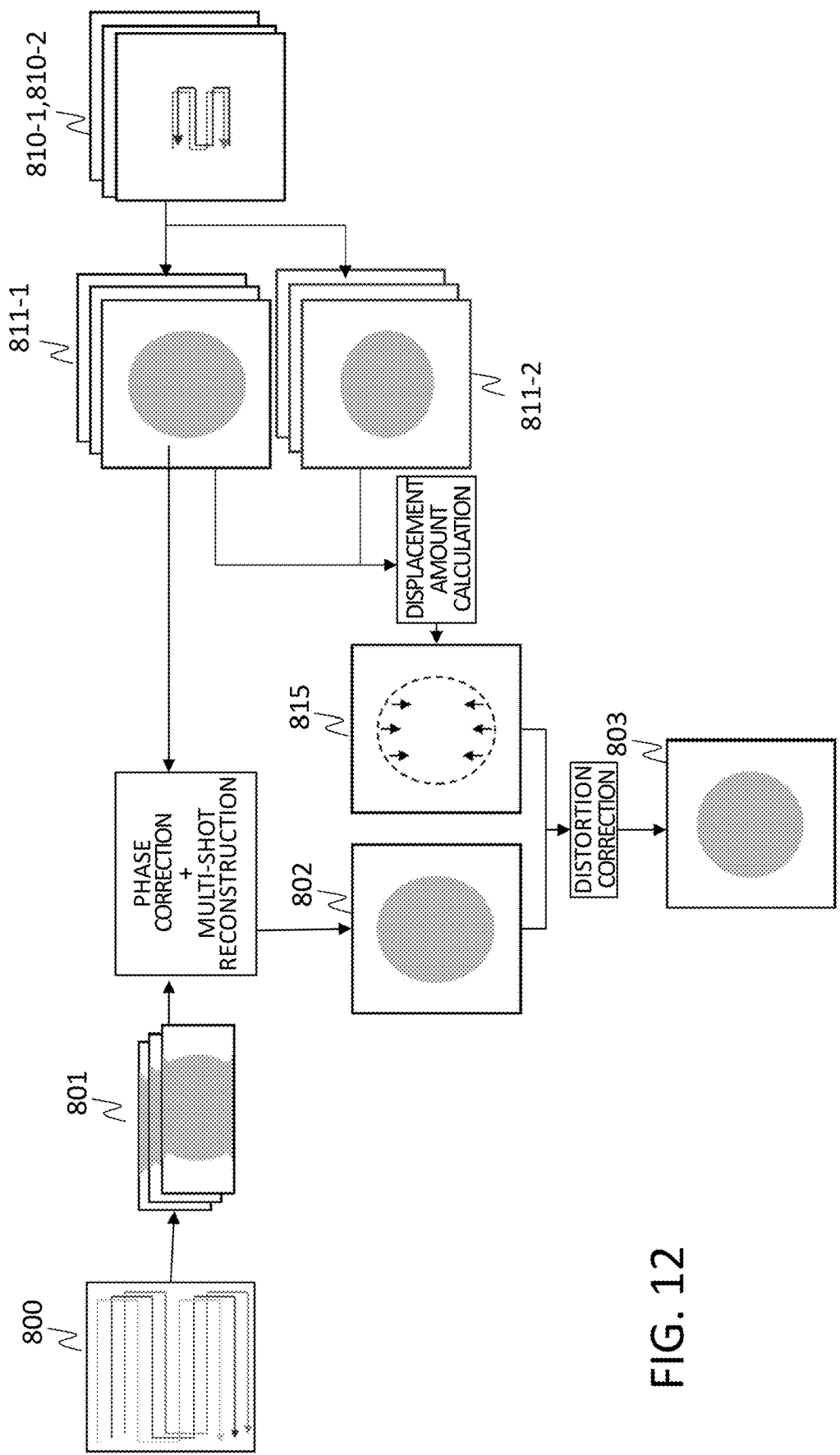
FIG. 12 is a diagram illustrating a process of the third embodiment.

As illustrated in FIG. 12, the image calculation unit 22 first converts the main scan data 800 and navigator scan data 810-1 and navigator scan data 810-2 obtained for each shot by the FT unit 221 into real space data, respectively, and generates the main scan image 801 and two navigator scan images 811-1 and 811-2.

Since the two navigator scan images 811-1 and 811-2 have different phase encoding polarities, the distortion directions are different, and for example, one is an image extending in the phase encoding direction and the other is an image contracting in the phase encoding direction. The displacement amount calculation unit 222 calculates the displacement amount for each pixel of the pair of synthesized navigator scan images 812-1 and 812-2, and creates a displacement amount map 815 (S1203).

The displacement amount can be obtained by obtaining a magnetic field distribution or a frequency distribution proportional to the magnetic field from two images having different polarities, and then converting the distribution into the displacement amount by using the above Formula (1). A method for estimating the magnetic field distribution from two images having different polarities can use a known method such as the method described in Non-Patent Literature 1.

The navigator scan images 811-1 and 811-2 for obtaining the displacement amount may be obtained by synthesizing images obtained for each shot, or may use a navigator scan image of a predetermined shot.

Meanwhile, in the two navigator scan images, the multi-shot reconstruction unit 224 uses information on the phase difference between shots of an image (image for each shot) 812-1 obtained by the navigator scan having the same applied polarity of the phase encoding as the main scan, and performs phase correction of the main scan image 801 for each shot and then synthesizes the main scan image 801 to generate the synthesized main scan image 802. Reconstruction processing including the phase correction can be performed by the same method as in the second embodiment.

Finally, the main scan distortion correction unit 223 corrects the synthesized main scan image 802 by using the displacement amount map 815 created by the displacement amount calculation unit 222, and obtains a corrected main scan image 803.

According to the present embodiment, the displacement amount is calculated by using two pieces of navigator scan data with different phase encoding polarities and navigator scan images with opposite distortion directions, and thus as compared with a case where the displacement amount is calculated from the navigator scan image and the main scan image as in the first and second embodiments, the displacement amount can be calculated with high accuracy, and the distortion correction with high accuracy can be performed.

When the main scan image is synthesized, the phase difference information obtained from the navigator scan image having the same polarity as the applied polarity of the phase encoding is used, and thus the accuracy of correction of the phase difference between shots is improved.

In the above description, the case where the main scan is the multi-shot EPI is described, and in the case of the single-shot, the only change is that the synthesized main scan image 802 in FIG. 12 is replaced with the main scan image obtained in the one shot, and the phase correction between the shots is omitted, and the same can be applied.

Modification of Third Embodiment

Also in the present modification, as in the third embodiment, two pieces of navigator scan data having different forward and reverse phase encoding application axes are used as the navigator scan data. In the third embodiment, the displacement amount map is calculated based on the navigator scan data and the distortion of the synthesized main scan image is corrected, and in the present modification, the distortion correction is performed on the navigator scan image, and multi-shot reconstruction of the main scan image of each shot is performed by using the distortion-corrected navigator scan image.

Figure 13:
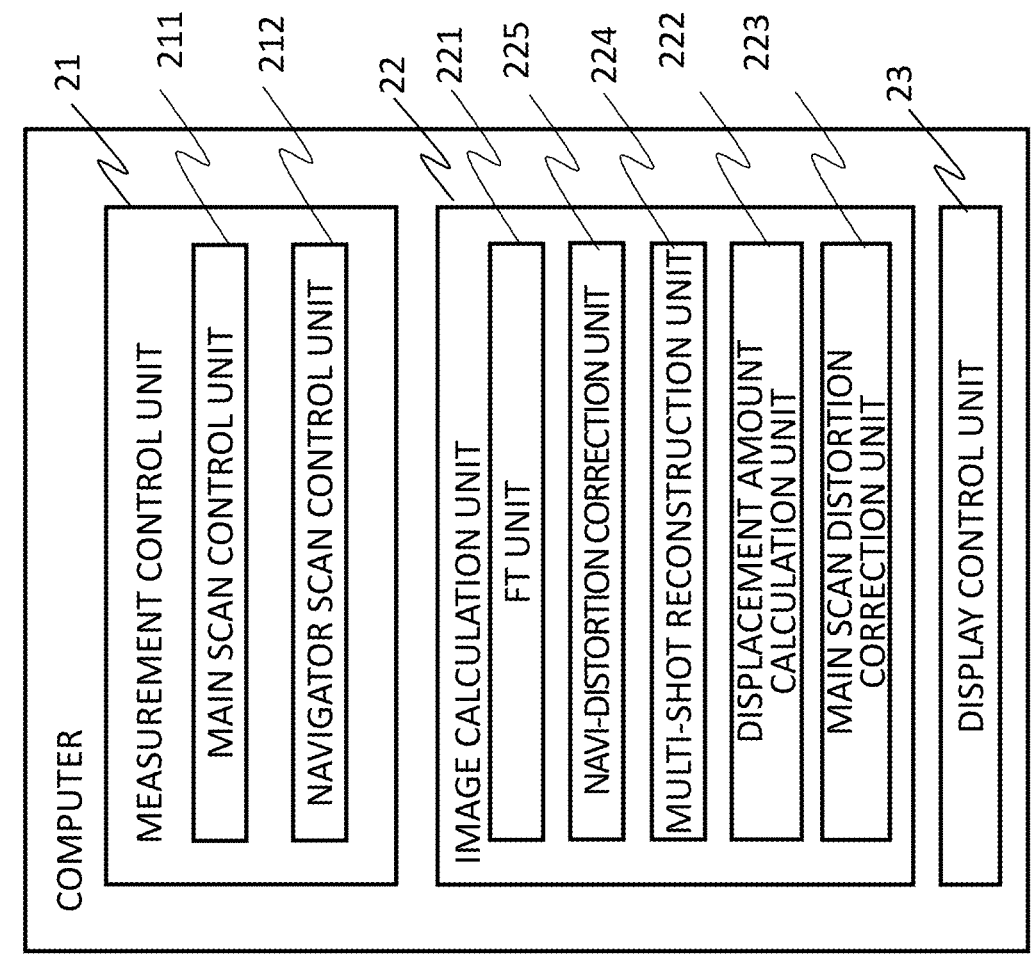
FIG. 13 is a functional block diagram of a computer of a modification of the third embodiment.

In the present modification, as illustrated in FIG. 13, a navi-distortion correction unit 225 is added to the configuration of the image calculation unit 22. The displacement amount calculation unit 222 may be omitted.

Figure 14:
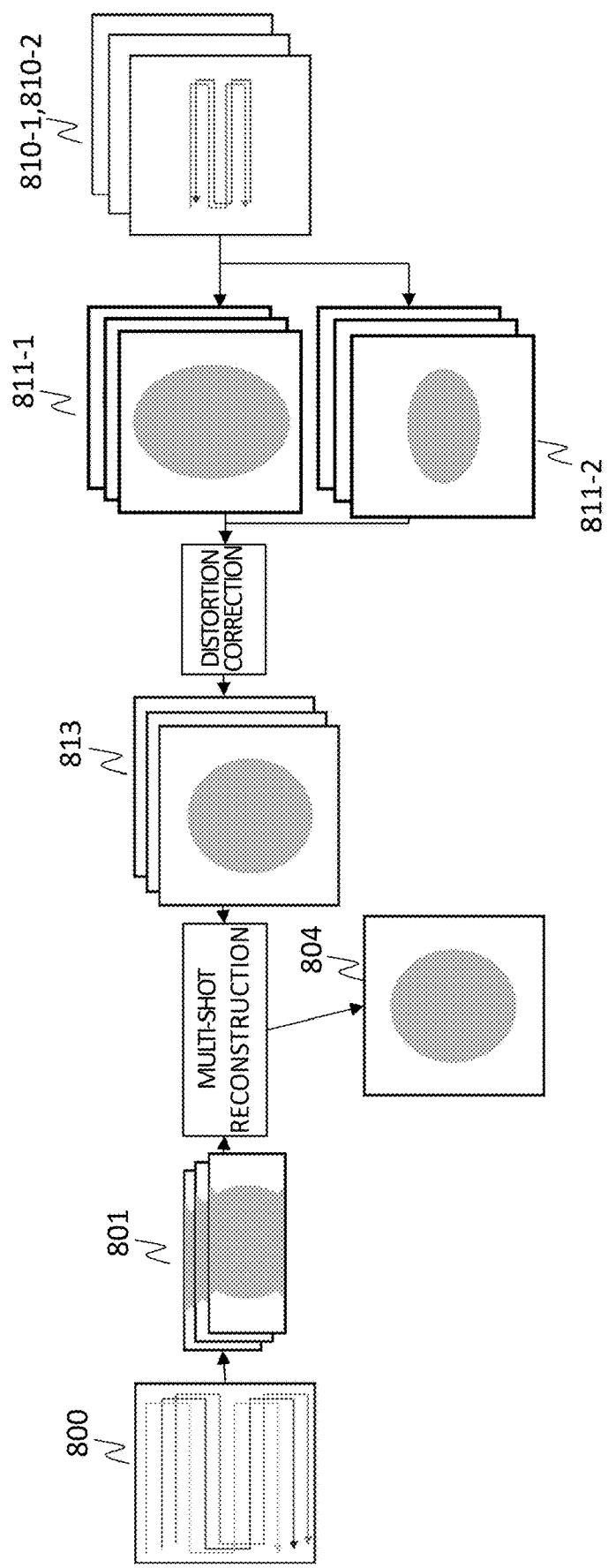
FIG. 14 is a diagram illustrating a process of a first modification of the third embodiment.

Hereinafter, among the processing of the image calculation unit 22, a point different from the third embodiment will be mainly described. FIG. 14 illustrates a processing flow of the present modification.

In the present embodiment, the pulse sequence executed by the measurement unit 10 is the same as that of the third embodiment, and as illustrated in FIG. 14, the main scan image 801 and two navigator scan images 811-1 and 811-2 are obtained for each shot from the main scan data 800 and the navigator scan data 810-1 and 810-2 having different phase encodings.

In the third embodiment, among the two navigator scan images, the navigator scan images obtained with the same polarity of the phase encoding with the main scan image are used to perform the phase correction during multi-shot reconstruction of the main scan image. In the present modification, however, first, the navi-distortion correction unit 225 corrects the distortion of the two navigator scan images. Since the two navigator scan images differ in that the polarities of phase encoding are opposite to each other, the distortions of the images are in different directions. Therefore, as follows, the navi-distortion correction unit 225 corrects the distortion of the two navigator scan images such that the two navigator scan images have the same degree of distortion as the main scan image, and obtains the corrected navigator scan image 813.

This can be achieved by using a known method shown in Non-Patent Literature 1 and the like to estimate a frequency image f(x, y) and correct the distortion based on the two navigator scan images, and then using Formula (1) depending on the FOV and IET of the main scan image to re-distort the image. Alternatively, after the frequency image f(x, y) is estimated, a positional deviation d(x, y) between the images at coordinates may be calculated based on the imaging conditions of both, and distortion correction may be performed according to the amount of d. Here, d(x, y) can be calculated from the following formula by using the distortion amounts of the main scan image and the navigator scan image (assumed to be $\Delta y_{scan}$ and $\Delta y_{navi}$, respectively).

$$d = \Delta y_{scan} - \Delta y_{navi} = f_0(x, y) \cdot FOV_y \cdot \left( \frac{IET_{scan}}{R_{scan} \cdot N_{sh}} - \frac{IET_{navi}}{R_{navi}} \right) \quad (3)$$

A corrected navigator scan image 813 is obtained for each shot. The multi-shot reconstruction unit 224 uses information on the phase error between shots of the corrected navigator scan image 813 to perform multi-shot reconstruction with phase correction on the main scan image 801 of each shot, and obtains a synthesized image 804.

In the present modification, by using the distortion-corrected navigator scan image 813 to perform the phase correction, high-precision correction can be performed, and an artifact due to the phase error during the multi-shot reconstruction can be prevented with high accuracy.

Figure 15:
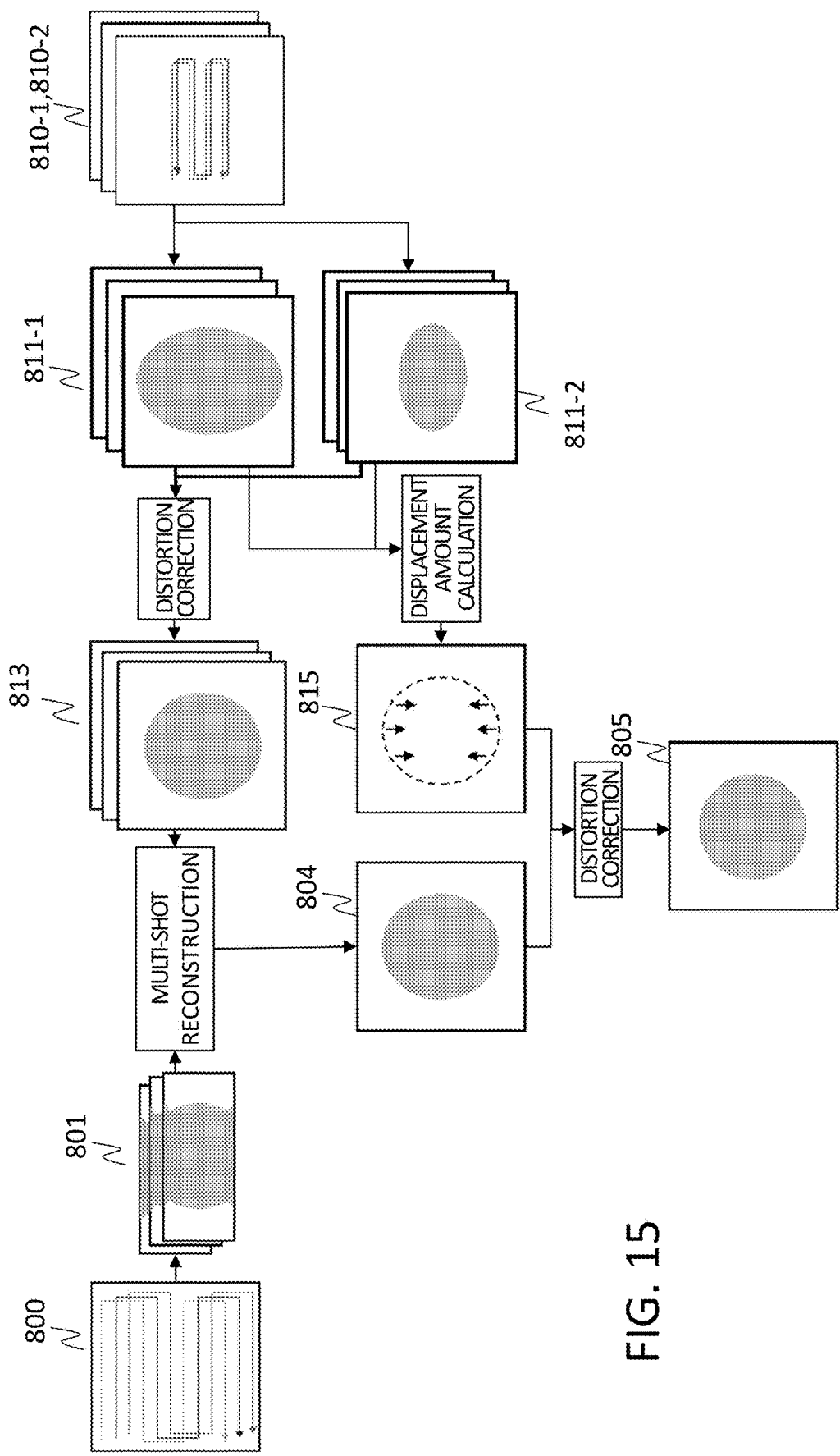
FIG. 15 is a diagram illustrating a process of a second modification of the third embodiment.

Therefore, in the present modification, the processing performed by the distortion correction unit 223 of the third embodiment can be omitted, but the same distortion correction as in the third embodiment for the main scan image after the multi-shot reconstruction can also be further performed. The processing is illustrated in FIG. 15. As illustrated in FIG. 15, in the distortion correction, similar to the third embodiment, the displacement amount is calculated based on the two navigator scan images 811-1 and 811-2, a displacement amount map 815 is calculated, and the distortion of the synthesized main scan image 802 is corrected based on the displacement map.

According to the present modification, the phase correction during the multi-shot reconstruction is performed by using the distortion-corrected navigator scan image, so that the accuracy of the phase correction can be further improved as compared with the third embodiment, and as a result, the accuracy of the distortion correction of the image after the shot reconstruction can be improved.

Figure 16:
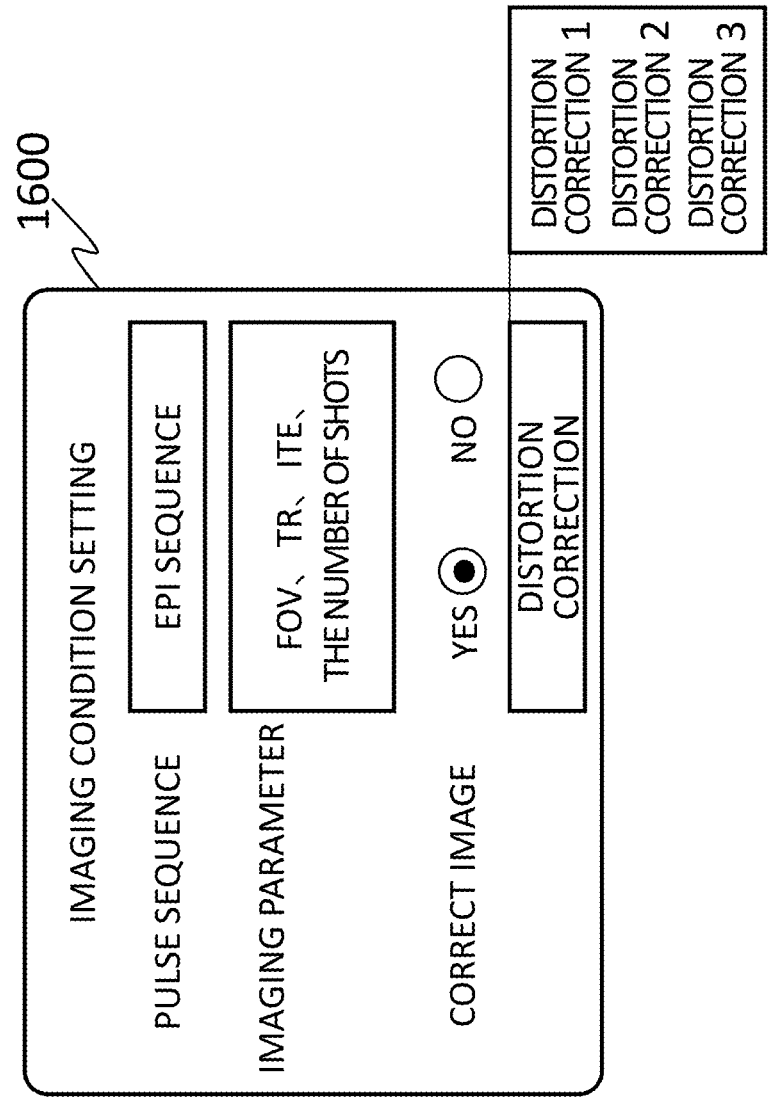
FIG. 16 is a diagram illustrating an example of a GUI of an MRI device.

Regarding the phase correction or the distortion correction of each of the above-described embodiments, when the EPI sequence and the number of shots of the EPI sequence are set as the pulse sequence included in the imaging condition, in a case of the single-shot, the distortion is automatically corrected by the method of the first or third embodiment (including the modification), and in a case of the multi-shot, the distortion correction of the second or third embodiment (including the modification) is automatically performed, and on an imaging condition setting screen 1600 for setting the pulse sequence and an imaging parameter as illustrated in FIG. 16, correction conditions may be set when the pulse sequence and the imaging parameter are set.

For example, when EPI is set as a pulse sequence, whether to perform the distortion correction can be selected, and when "YES" is selected in the distortion correction, the user may select desired distortion correction by using a pull-down menu method or opening a new setting screen.

The embodiments and the modifications thereof are described above, but the invention is not limited to these embodiments, and various modifications can be made such as combining known techniques regarding image reconstruction. Although the case of performing DWI is described, the invention can be applied even to a normal EPI sequence without using an MPG pulse.

What is claimed is:

1. A magnetic resonance imaging device comprising:
a measurement unit configured to collect a nuclear magnetic resonance signal from a subject, the measurement unit executing a pulse sequence including performing, after applying one excitation RF pulse (1 shot), a main scan for measuring an echo signal for image reconstruction, and a navigator scan for measuring an echo signal for distortion correction, an applied polarity of phase encoding in the navigator scan being opposite to an applied polarity of phase encoding in the main scan; and
an image calculation unit configured to generate an image by using the nuclear magnetic resonance signal collected by the measurement unit,
the image calculation unit including
a displacement amount calculation unit configured to calculate a displacement amount of a main scan image, by using the echo signal obtained by the navigator scan, and
a distortion correction unit configured to correct distortion of the main scan image by using the displacement amount calculated by the displacement amount calculation unit, to cause a corrected image to be output.

2. A control method of a magnetic resonance imaging device comprising: a measurement unit configured to collect a nuclear magnetic resonance signal from a subject using a pulse sequence; and an image calculation unit configured to generate an image by using the nuclear magnetic resonance signal collected by the measurement unit, the control method comprising:
a measuring step of causing the measurement unit to execute a pulse sequence including performing, after applying one excitation RF pulse, a main scan for measuring an image reconstruction echo signal, and a navigator scan for measuring a distortion correction echo signal, an applied polarity of phase encoding in the navigational scan being opposite to an applied polarity of phase encoding in the main scan; and an image processing step of calculating a displacement amount of a main scan image, by using an echo signal obtained by the navigator scan, and correcting distortion of the main scan image by using the displacement amount, to cause a corrected image to be output.

3. The magnetic resonance imaging device according to claim 1, wherein
the pulse sequence is a single shot sequence that collects all echoes for image reconstruction with one excitation RF pulse, and
the distortion correction unit uses the distortion correction by the navigator scan to correct distortion of the main scan image corresponding to the echo signal measured by the main scan, by using the displacement amount calculated by the displacement amount calculation unit.

4. The magnetic resonance imaging device according to claim 1, wherein
the pulse sequence is a multi-shot sequence that collects echoes for image reconstruction by using two or more excitation RF pulses, and
the image calculation unit further includes a multi-shot reconstruction unit configured to synthesize the echo signal obtained in the main scan of each shot, and the multi-shot reconstruction unit uses phase information on a navigator scan image obtained by the navigator scan of each shot to perform phase correction and synthesize an image corresponding to the echo signal obtained by the main scan of each shot.

5. The magnetic resonance imaging device according to claim 4, wherein the distortion correction unit uses the navigator scan image obtained by the navigator scan to correct distortion of the main scan image synthesized by the multi-shot reconstruction unit by using the calculated displacement amount.

6. The magnetic resonance imaging device according to claim 1, wherein
the navigator scan includes a first navigator scan in which an applied polarity of phase encoding is the same as that of the main scan, and a second navigator scan in which the applied polarity of the phase encoding is opposite to that of the main scan, and
the displacement amount calculation unit calculates the displacement amount by using a navigator scan image obtained by the first navigator scan and a navigator scan image obtained by the second navigator scan.

7. The magnetic resonance imaging device according to claim 6, wherein
the pulse sequence is a multi-shot echo planar sequence that collects the echoes for image reconstruction by using the two or more excitation RF pulses,
the image calculation unit further includes a multi-shot reconstruction unit configured to synthesize the echo signal obtained in the main scan of each shot, and
the distortion correction unit uses the displacement amount to correct distortion of the main scan image synthesized by the multi-shot reconstruction unit.

8. The magnetic resonance imaging device according to claim 7, wherein
the multi-shot reconstruction unit uses the phase information on the navigator scan image obtained in the first navigator scan to perform phase correction and synthesize the image obtained in the main scan of each shot.

9. The magnetic resonance imaging device according to claim 1, wherein
the pulse sequence is a multi-shot echo planar sequence that collects echoes for image reconstruction by using two or more excitation RF pulses, the navigator scan includes a first navigator scan in which an applied polarity of phase encoding is the same as that of the main scan, and a second navigator scan in which the applied polarity of the phase encoding is opposite to that of the main scan,
the image calculation unit further includes a multi-shot reconstruction unit configured to synthesize the echo signal obtained in the main scan of each shot, and a navi-distortion correction unit configured to generate a distortion-corrected navigator scan image by using a navigator scan image obtained by the first navigator scan and a navigator scan image obtained by the second navigator scan, and
the multi-shot reconstruction unit uses phase information on a distortion-corrected navigator scan image generated by the navi-distortion correction unit to perform phase correction and synthesize the image obtained in the main scan of each shot.

10. The magnetic resonance imaging device according to claim 9, wherein
the displacement amount calculation unit calculates the displacement amount by using the navigator scan image obtained by the first navigator scan and the navigator scan image obtained by the second navigator scan, and
the distortion correction unit uses the displacement amount to correct the main scan image synthesized by the multi-shot reconstruction unit.

11. The magnetic resonance imaging device according to claim 1, wherein
the pulse sequence includes an MPG pulse, and
the image calculation unit generates a DWI image as the main scan image.

12. The control method of the magnetic resonance imaging device according to claim 2, wherein
the navigator scan includes a first navigator scan in which an applied polarity of phase encoding is the same as an applied polarity of the main scan, and a second navigator scan in which an applied polarity of the phase encoding is opposite to that of the main scan, and
in the image processing step, the displacement amount used for the distortion correction of the main scan image is calculated by using an image obtained by the first navigator scan and an image obtained by the second navigator scan.

13. The control method of the magnetic resonance imaging device according to claim 2, wherein
the navigator scan includes a first navigator scan in which an applied polarity of phase encoding is the same as an applied polarity of the main scan, and a second navigator scan in which applied polarity of the phase encoding is opposite to that of the main scan, and
the image processing step further includes a step of correcting a phase of the main scan image by using phase information on the navigator scan image obtained in the first navigator scan.

14. The control method of the magnetic resonance imaging device according to claim 2, wherein
the navigator scan includes a first navigator scan in which an applied polarity of phase encoding is the same as an applied polarity of the main scan, and a second navigator scan in which applied polarity of the phase encoding is opposite to that of the main scan, and
the image processing step further includes a step of generating a distortion-corrected navigator scan image by using an image obtained by the first navigator scan and an image obtained by the second navigator scan and a step of correcting a phase of a main scan image by using the distortion-corrected navigator scan image.

15. The control method of the magnetic resonance imaging device according to claim 2, wherein
the pulse sequence is a multi-shot echo planar sequence that collects echoes for image reconstruction by using two or more excitation RF pulses, and includes application of an MPG pulse for each shot.

* * * * *